US008365110B2

(12) United States Patent
Chang et al.

(10) Patent No.: US 8,365,110 B2
(45) Date of Patent: Jan. 29, 2013

(54) AUTOMATIC ERROR DIAGNOSIS AND CORRECTION FOR RTL DESIGNS

(75) Inventors: Kai-Hui Chang, Andover, MA (US); Ilya Wagner, Bloomfield, MI (US); Igor Markov, Ann Arbor, MI (US); Valeria Bertacco, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 835 days.

(21) Appl. No.: 12/127,523

(22) Filed: May 27, 2008

(65) Prior Publication Data

US 2008/0295043 A1 Nov. 27, 2008

Related U.S. Application Data

(60) Provisional application No. 60/940,290, filed on May 25, 2007.

(51) Int. Cl.
*G06F 9/455* (2006.01)
*G06F 17/50* (2006.01)

(52) U.S. Cl. ........ 716/106; 716/101; 716/102; 716/111; 716/112; 716/139; 717/124; 717/125; 717/126; 717/127

(58) Field of Classification Search .......... 716/101–103, 716/106, 107, 136, 139, 111, 112; 717/124, 717/125, 726, 27
See application file for complete search history.

(56) References Cited

U.S. PATENT DOCUMENTS

| | | | | |
|---|---|---|---|---|
| 6,363,520 | B1 * | 3/2002 | Boubezari et al. | 716/103 |
| 6,816,825 | B1 * | 11/2004 | Ashar et al. | 703/14 |
| 7,434,181 | B2 * | 10/2008 | Colle et al. | 716/136 |
| 2006/0195822 | A1 * | 8/2006 | Beardslee et al. | 717/124 |
| 2007/0180414 | A1 * | 8/2007 | Harer et al. | 716/5 |
| 2008/0127009 | A1 * | 5/2008 | Veneris et al. | 716/4 |

OTHER PUBLICATIONS

Ali et al., "Debugging Sequential Circuits Using Boolean Satisfiability", *ICCAD*, pp. 44-49 (2004).
Bloem and Wotawa, "Verification and Fault Localization for VHDL Programs", *Journal of the Telematics Engineering Society* (*TIV*), pp. 30-33, vol. 2 (2002).
Chang et al., "Fixing Design Errors with Counterexamples and Resynthesis", *ASPDAC*, pp. 944-949 (2007).
Chang et al., "Simulation-based Bug Trace Minimization with BMC-based Refinement", *ICCAD*, pp. 1045-1051 (2005).
Eén et al., "An extensible SAT-solver," in Proc. Theory and Applications of Satisfiability Testing, pp. 502-518 (2003).
Jiang et al., "Estimating Likelihood of Correctness for Error Candidates to Assist Debugging Faulty HDL Designs," *ISCAS*, 2005, pp. 5682-5685.
K. H. Chang, et al. "Automatic Error Diagnosis and Correction for RTL Designs" ACM/IEEE Int'l Workshop on Logic and Synthesis (IWLS), San Diego, CA, pp. 106-113 (2007).
Rau et al., "An Efficient Mechanism for Debugging RTL Description", *IWSOC*, 2003, pp. 370-373.
Shi et al. "An Efficient Approach for Error Diagnosis in HDL Design", in *Proc ISCAS*, 2003, pp. 732-735.

(Continued)

*Primary Examiner* — Nha Nguyen
(74) *Attorney, Agent, or Firm* — Marshall, Gerstein & Borun LLP

(57) ABSTRACT

A computer executable tool facilitates integrated circuit design and debugging by working directly at the Register Transfer Level, where most design activities take place. The tool determines when an integrated circuit design produces incorrect output responses for a given set of input vectors. The tool accesses the expected responses and returns the signal paths in the integrated circuit that are responsible for the errors along with suggested changes for fixing the errors. The tool may operate at the RTL, which is above the gate-level abstraction which means that the design errors will be much more readily understood to the designer, and may improve scalability and efficiency.

33 Claims, 10 Drawing Sheets

OTHER PUBLICATIONS

Smith et al., "Design Diagnosis Using Boolean Satisfiability", *ASPDAC*, pp. 218-233 (2004).

Staber et al., "Finding and Fixing Faults", in *CHARME*, Springer-Verlag LNCS 3725, pp. 35-49 (2005).

Staber, et al. "Automatic Fault Localization for Property Checking" Computer-Aided Design of Integrated Circuits and Systems, IEEE Transactions, 27(6): 1138-1149 (2008).

Chang et al., "Automatic Error Diagnosis and Correction for RTL Designs", *IEEE Int'l High Level Design Validation and Test Workshop* (*HLDVT*), Irvine, CA, pp. 65-72 (Nov. 2007).

Chang et al., "Fixing Design Errors with Counterexamples and Resynthesis", *ASPDAC*, pp. 944-949 (Jan. 2007).

Staber et al., "Automatic Fault Localization for Property Checking", presented at Second International Haifa Verification Conference, pp. 1-38 (Oct. 23, 2006).

Staber et al., "Automatic Fault Localization for Property Checking", in *Hardware and Software, Verification and Testing: Second International Haifa Verification Conference, Hvc 2006*, Springer-Verlag LNCS 4383, pp. 50-64 (Mar. 2007).

* cited by examiner

```
module half_adder(a, b, s, c);
  input a, b;
  output s, c;
  assign s = a ^ b;
  assign c = a | b;
endmodule
```

```
module half_adder_enriched (a, b, s_n, c_n,
s_sel, c_sel, s_f, c_f);
  input a, b, s_sel, c_sel, s_f, c_f;
  output s_n, c_n;
  assign s = a ^ b;
  assign c = a | b;
  assign s_n = s_sel ? s_f : s;
  assign c_n = c_sel ? c_f : c;
endmodule
```

Procedure for conditional Assignment_enrichment (v)

1. create a new signal wire $v_n$ and new inputs $v_f$ and $v_{sel}$;
2. add conditional assignment "$v_n = v_{sel}\ ?\ v_f : v$";
3. replace all occurrences of $v$ that appear on the right-hand-side of assignments (including outputs, if/case conditions, etc.) with $v_n$;

FIG. 3

Procedure *syn_based_diagnosis*(*designCNF*, *c*, *inputs*, *outputs*);
*CNF* = unroll *designCNF* *c* times;
connect all *select variables* in CNF to those in the first cycle;
constrain PI/PO in CNF using *inputs*/*outputs*;
*PBC* = *CNF*, min( $\sum$ *select variables*);
return solution= PB-Solve(*BPC*);

FIG. 4

Procedure *sim_based_diagnosis*(*design*, *test_vectors*, *CPO*);
$\forall i, 1 \leq i \leq n, \mathbf{v}_{i\_sel} = new\_symbol()$;
for $t = 1$ to $c$ begin // Simulate $c$ cycles
PI = *test_vector* at cycle $t$;
$\forall i, 1 \leq i \leq n, \mathbf{v}_{i\_f@t} = new\_symbol()$;
$PO_{@t} = simulate(design)$;
end
$PBC = \bigwedge_{j=1}^{o} \bigwedge_{t=1}^{c} (\mathbf{PO}_{j@t} = CPO_{j@t})$, $\min(\sum_{i=1}^{n} \mathbf{v}_{i\_sel})$;
return solution= *PB_Solve*(*PBC*);

FIG. 5

```
module example(clk, I1, I2, O1_n, O2_n, g1_sel, O1_sel,
O2_sel, g1_f, O1_f, O2_f);
  input I1, I2, g1_sel, O1_sel, O2_sel, g1_f, O1_f, O2_f
  output O1_n, O2_n;
  reg r1, r2;
  initial begin r1= 0; r2= 0; end
  always @(posedge clk) begin
    r1= I1; r2= I2;
  end
  assign g1 = r1 | r2;
  assign O1 = I1 | g1_n;
  assign O2 = I2 & g1_n;
  assign g1_n= g1_sel ? g1_f : g1;
  assign O1_n= O1_sel ? O1_f : O1;
  assign O2_n= O2_sel ? O2_f : O2;
endmodule
```

FIG. 6

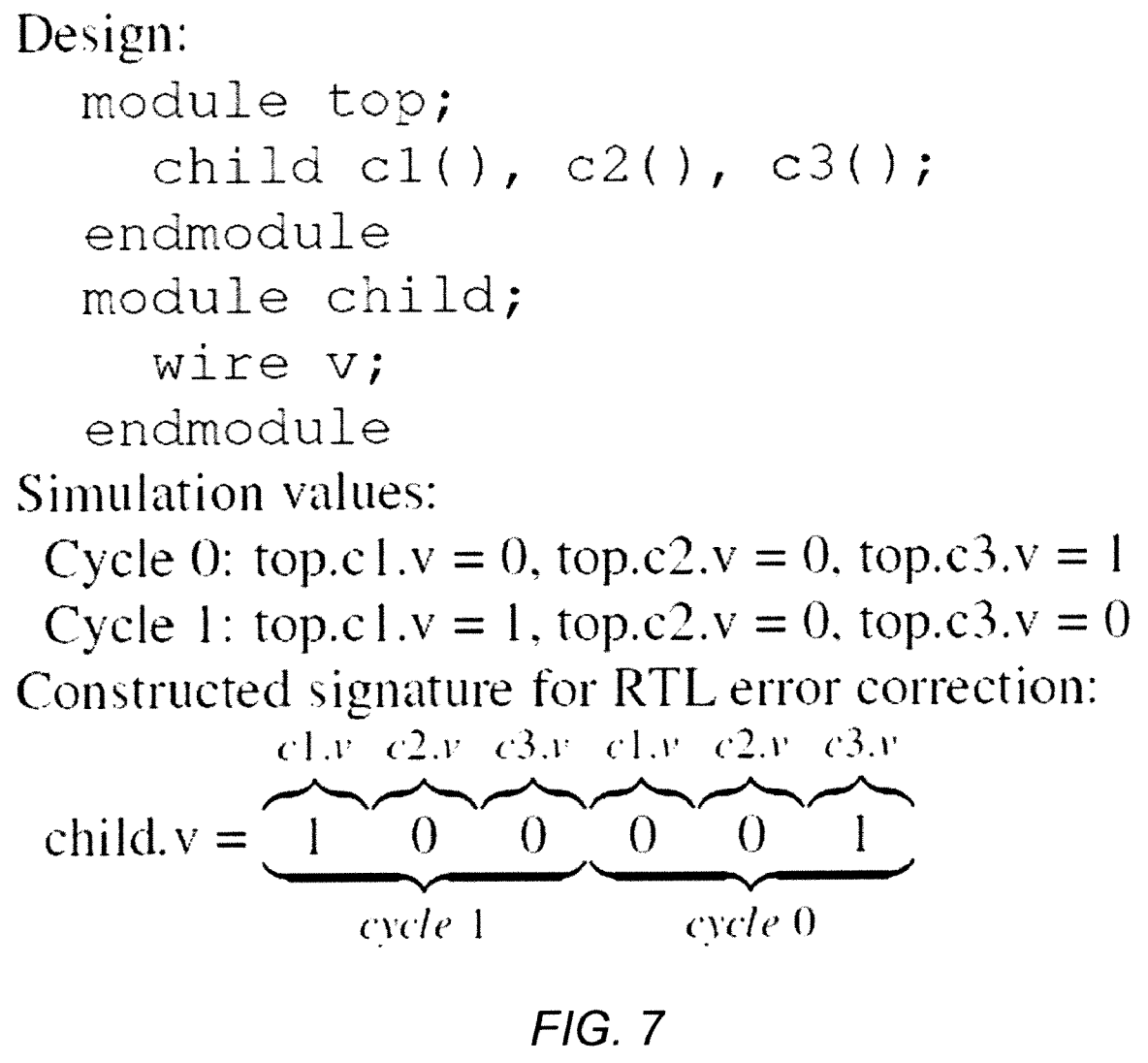

Design:

```
module top;
  child c1(), c2(), c3();
endmodule
module child;
  wire v;
endmodule
```

Simulation values:

Cycle 0: top.c1.v = 0, top.c2.v = 0, top.c3.v = 1

Cycle 1: top.c1.v = 1, top.c2.v = 0, top.c3.v = 0

Constructed signature for RTL error correction:

*c1.v* *c2.v* *c3.v* *c1.v* *c2.v* *c3.v* child.v = 1 0 0 0 0 1

*cycle* 1 *cycle* 0

FIG. 7

| Benchmark | Description | #Flip-flops | Trace type | Gate-level [1, 14] | | RTL (Ours) | |
|---|---|---|---|---|---|---|---|
| | | | | #Cells | #MUXes | #Lines | #Assign |
| Pipe | Part of PicoJava pipeline control unit | 2 | Constrained-random | 55 | 72 | 264 | 31 |
| Pre_norm | Part of FPU | 71 | Constrained-random | 1877 | 1877 | 270 | 43 |
| MD5 | MD5 full chip | 910 | Direct test | 13311 | 13313 | 438 | 37 |
| MiniRISC | MiniRISC full chip | 887 | Direct test | 6402 | 6402 | 2013 | 43 |
| CF_FFT | Part of the CF_FFT chip | 16,638 | Constrained-random | 126532 | 126560 | 998 | 223 |
| DLX | 5-stage pipeline CPU running MIPS-Lite ISA | 2,062 | Constrained-random | 14725 | 14727 | 1225 | 84 |
| Alpha | 5-stage pipeline CPU running Alpha ISA | 2,917 | Constrained-random | 38299 | 38601 | 1841 | 134 |

*Table 1*

*FIG. 8*

| Bench-mark | Bug ID | Description |
|---|---|---|
| Pipe | A | One signal inverted |
| Pre_norm | A | Reduced OR replaced by reduced AND |
| | B | One signal inverted |
| | C | One 26-bit bus MUX select line inverted |
| | D | Bug A + Bug B |
| | E | Bug A + Bug B + Bug C |
| MD5 | A | Incorrect operand for a 32-bit addition |
| | B | Incorrect state transition |
| | C | Bug B with a shorter trace |
| MRISC | A | Incorrect RHS for a 11-bit value assignment |
| CF_FFT | A | One signal inverted |
| DLX | A | SLL inst. does shift the wrong way |
| | B | SLTIU inst. selects the wrong ALU operation |
| | C | JAL inst. leads to incorrect bypass from MEM stage |
| | D | Incorrect forwarding for ALU+IMM inst. |
| | E | Does not write to reg31 |
| | F | RT reads lower 30 bits only |
| | G | If RT = 7 memory write is incorrect |
| Alpha | A | Write to zero-reg succeeds if rdb_idx = 5 |
| | B | Forwarding through zero reg on rb |
| | C | Squash if source of MEM/WB = dest. of ID/EX and instr. in ID is not a branch |

*Table 2*

*FIG. 9*

| Bench-mark | Bug ID | Bug traces | | Gate-level diagnosis [2, 19] | | | | | | RTL diagnosis (Our work) | | | | | |
|---|---|---|---|---|---|---|---|---|---|---|---|---|---|---|---|
| | | #traces | #cycles | Combinational | | | Sequential | | | Combinational | | | Sequential | | |
| | | | | Errors found | | Runtime (sec) | Errors found | | Runtime (sec) | Errors found | | Runtime (sec) | Errors found | | Runtime (sec) |
| | | | | #Sites | #Cores | | #Sites | #Cores | | #Symp. | #Cores | | #Symp. | #Cores | |
| Pipe | A | 32 | 200 | 1 | 1 | 6.9 | 1 | 1 | **7.1** | 1 | 1 | 6.0 | 1 | 1 | **6.0** |
| Pre_norm | A | 32 | 20 | 1 | 1 | 51.1 | 1 | 1 | **63.6** | 1 | 1 | 13.2 | 1 | 1 | **13.2** |
| | B | 32 | 20 | 1 | 3 | 41.6 | 1 | 4 | **46.7** | 1 | 1 | 11.4 | 1 | 2 | **13.4** |
| | C | 32 | 20 | **Time-out (48 hours) with > 10 error sites** | | | | | | 1 | 1 | 11.4 | 1 | 1 | **11.4** |
| | D | 32 | 20 | 2 | 3 | 73.3 | 2 | 4 | **88.7** | 2 | 1 | 12.4 | 2 | 2 | **13.8** |
| | E | 32 | 20 | **Time-out (48 hours) with > 8 error sites** | | | | | | 3 | 2 | 13.9 | 3 | 4 | **17.4** |
| MD5 | A | 1 | 200 | **Time-out (48 hours) with > 6 error sites** | | | | | | 1 | 1 | 83.3 | 1 | 3 | **173.2** |
| | B | 1 | 200 | 1 | 2 | 10,980 | 1 | 4 | **41,043** | 1 | 1 | 42.9 | 1 | 2 | **110.1** |
| | C | 1 | 50 | 1 | 3 | 2,731 | 1 | 28 | **17,974** | 1 | 1 | 14.1 | 1 | 6 | **49.8** |
| MRISC | A | 1 | 500 | States unavailable | | | **Time-out (48 hours)** | | | States unavailable | | | 1 | 2 | **32.0** |
| CF_FFT | A | 32 | 15 | 1 | 1 | 109,305 | Trace unavailable | | | 1 | 4 | 364.8 | Trace unavailable | | |
| DLX | A | 1 | 150 | Time-out (48 hours) | | | **Out of memory** | | | 1 | 1 | 41.2 | 1 | 3 | **220.8** |
| | B | 1 | 68 (178) | 1 | 20 | 15,261 | **Out of memory** | | | 1 | 4 | 54.8 | 1 | 17 | **1886.3** |
| | C | 1 | 47 (142) | 1 | 45 | 11,436 | 1 | 170 | **34,829** | 1 | 5 | 15.8 | 1 | 11 | **104.0** |
| | D | 1 | 77 (798) | 1 | 6 | 18,376 | 1 | 6 | **49,787** | 1 | 3 | 27.5 | 1 | 9 | **2765.1** |
| | E | 1 | 49 (143) | 1 | 12 | 9743.5 | 1 | 193 | **19,621** | 1 | 4 | 19.1 | 1 | 12 | **105.2** |
| | F | 1 | 188 | 1 | 10 | 15,184 | **Out of memory** | | | 1 | 2 | 67.8 | 1 | 2 | **457.4** |
| | G | 1 | 30 (1080) | 1 | 9 | 4160.1 | Trace unavailable | | | 1 | 1 | 11.3 | Trace unavailable | | |
| Alpha | A | 1 | 70(256) | **Time-out (48 hours)** | | | | | | 1 | 5 | 127.4 | 1 | 9 | **525.3** |
| | B | 1 | 83(1433) | **Time-out (48 hours)** | | | | | | 1 | 5 | 111.6 | 1 | 5 | **368.9** |
| | C | 1 | 150(9950) | **Out of memory** | | | | | | 1 | 3 | 122.3 | 1 | 3 | **250.5** |

*Table 3*

*FIG. 10*

| Bench-mark mark | Bug ID | #Cores fixed | Resyn. method | #Fixes | Runtime (sec) |
|---|---|---|---|---|---|
| Pipe | A | 1 | GDS | 2214 | 1.0 |
| Pre_norm | A | 1 | GDS | 4091 | 1.1 |
| | B | 1 | GDS | 4947 | 2.4 |
| | C | 1 | GDS | 68416 | 5.6 |
| | D | 2 | GDS | 79358 | 7.1 |
| | E | 3 | GDS | 548037 | 41.6 |
| MD5 | A | 1 | GDS | 33625 | 4.1 |
| | B | 0 | GDS | 0 | 3.86 |
| CF_FFT | A | 3 | GDS | 214800 | 141.6 |
| DLX | A | 0 | GDS | 0 | 1.3 |
| | B | 3 | GDS | 5319430 | 111.2 |
| | C | 5 | EGS | 5 | 1.6 |
| | D | 3 | EGS | 3 | 1.6 |
| | E | 4 | EGS | 4 | 1.4 |
| | F | 2 | EGS | 2 | 2.9 |
| | G | 1 | GDS | 51330 | 0.7 |
| Alpha | A | 5 | EGS | 5 | 7.9 |
| | B | 4 | EGS | 4 | 10.4 |
| | C | 3 | EGS | 3 | 8.5 |

*Table 4*

*FIG. 11*

AUTOMATIC ERROR DIAGNOSIS AND CORRECTION FOR RTL DESIGNS

CROSS-REFERENCE TO RELATED APPLICATION

The present application claims the benefit of U.S. Provisional Application No. 60/940,290, entitled "Automatic Error Diagnosis and Correction for RTL Designs," filed on May 25, 2007, which is hereby incorporated by reference herein in its entirety.

BACKGROUND OF THE DISCLOSURE

1. Field of the Disclosure

The disclosure relates generally to integrated circuit design and, more particularly, to techniques for detecting and correcting errors in integrated circuit design.

2. Brief Description of Related Technology

The dramatic increase in design complexity of modern electronics challenges the ability of developers to ensure their functional correctness. While improvements in verification allow engineers to find a larger fraction of design errors more efficiently, little effort has been devoted to fixing such errors. As a result, debugging remains an expensive and challenging task.

To address this problem, researchers have recently started to propose techniques that automate the debugging process, by locating the error source within a design and/or by suggesting possible corrections. The root causes of functional errors can be several, ranging from poor specifications, miscommunication among designers, or conceptual or typing mistakes by a designer. Often these errors occur in the Register-Transfer Level (RTL) description of a design because most design activities are carried out at this level. RTL abstraction is used in hardware description languages (HDLs) to create high-level representations of a circuit, from which lower-level representations and wiring actualization can be derived. Although in theory errors can be corrected either at the RTL or the gate level, most solutions proposed in the literature use a gate-level description (netlist) as the underlying model. On one hand, this model presents some valuable advantages. For instance, RTL modifications at late design stages are undesirable because they may invalidate previous optimizations and hamper design closure; errors due to flawed synthesis tools are also only visible at the gate level. Finally, hard-IP blocks usually do not have an associated RTL description.

On the other hand, fixing errors at the RTL could offer several important advantages not available at the gate level. First, error diagnoses are generally most readily understood at the RTL. Second, in an RTL block the change propagates to all netlists synthesized from that code, while a correction at the gate level is only effective for one netlist. Third, corrections at the RTL require fewer changes, which are more effective, since in general a single erroneous RTL statement may affect a large portion of the corresponding netlist. In addition, the complexity of locating the source of bugs at the gate level grows considerably for compound errors (that is, when several error sources are present in the same design). Finally, since mapping the results of gate-level diagnosis back to the RTL is a difficult task, most often RTL errors can only be located through an RTL-based analysis.

To support this effort, tools such as waveform viewers and simulation assertions are often used at the forefront of debugging activities in industry. However, even with these tools, diagnosing the root cause of an error and fixing it still requires engineers' expertise, time, and effort. Existing techniques that address these problems range in their scope. For instance, the algorithms developed by Shi et al. "An Efficient Approach for Error Diagnosis in HDL Design", in *Proc ISCAS,* 2003, pp. 732-735, Jiang et al., "Estimating Likelihood of Correctness for Error Candidates to Assist Debugging Faulty HDL Designs," *ISCAS,* 2005, pp. 5682-5685 and Rau et al., "An Efficient Mechanism for Debugging RTL Description", *IWSOC,* 2003, pp. 370-373 generate lists of potentially error locations. Bloem and Wotawa, "Verification and Fault Localization for VHDL Programs", *Journal of the Telematics Engineering Society* (*TIV*), pp. 30-33, Vol. 2, 2002 take a different approach by formally analyzing an HDL description and its failed properties. Because of this their technique can only be deployed in a formal verification framework and cannot be applied in a simulation-based verification flow common in the industry today.

The work by Staber et al., "Finding and Fixing Faults", in *CHARME*, Springer-Verlag LNCS 3725, 2005, pp. 35-49 can diagnose and correct RTL design errors automatically, but it relies on state-transition analysis and hence, it does not scale beyond tens of state bits. In addition, this algorithm requires a correct formal specification of the design, which is rarely available in today's design environments, because its development is often as challenging as the design process itself. In contrast, the most common type of specification available is a high-level model, often written in a high-level language, which produces the correct I/O behavior of the system.

To develop a scalable and powerful RTL error diagnosis and correction system, a set of fundamentally new constructs and algorithms are desired.

SUMMARY OF THE DISCLOSURE

In this application we propose several constructs and algorithms that provide a new way to diagnose and correct errors at the RTL, including: (1) an innovative RTL error modeling construct; (2) scalable error-diagnosis algorithms using Pseudo-Boolean constraints, synthesis, and simulation; and (3) a novel error-correction technique using signatures. To empirically validate the techniques, we developed a novel verification framework, called REDIR. To this end, our experiments with industrial designs demonstrate that REDIR is efficient and scalable. In particular, designs up to a few thousand lines of code (e.g., 100K cells after synthesis) can be handled within minutes. In addition, the described techniques can diagnose significantly more bugs than state-of-art gate-level approaches. The results indicate that error diagnosis at the RTL is rather different from that at the gate level, and applying gate level diagnosis algorithms to RTL is ineffective. Since the techniques rely on correct output responses and support both combinational and sequential circuits, they can be applied to various designs in all mainstream verification flows. Therefore, the algorithmic techniques and the overall methodology proposed in our work can greatly facilitate the RTL debugging process and improve the overall verification quality.

With the present techniques, a controller may use conditional assignments to modify the RTL modules forming the overall RTL design for an integrated circuit. These modified (enriched) RTL modules have conditional assignments that may be adjusted (e.g., switched) by the framework and tested to determine which signals are problematic. The techniques may execute an error-diagnosis algorithm that converts an error-diagnosis problem of the enriched RTL modules into a Pseudo-Boolean (PB) problem, and then may use a PB solver to perform the diagnosis and infer which design RTL signals are responsible for the incorrect output behavior.

By way of background, PB problems, also called 0-1 integer linear programming problems, are an extension of SATisfiability problems. PB constraints are specified as an inequality with a linear combination of Boolean variables: $C_0p_o+C_1p_1+ \ldots +C_{n-1}p_{n-1} \geqq C_n$, where the variables $p_i$ are defined over the Boolean set {0, 1}. A PB problem allows the use of an additional objective function, which is a linear expression that should be minimized or maximized under the given constraints. A number of PB solvers have been developed recently by extending existing SAT solvers (for instance, MiniSAT).

Gate-level Error Diagnosis Techniques—The power and effectiveness of the gate-level error diagnosis techniques have been recently discussed in the work of Smith et al., "Design Diagnosis Using Boolean Satisfiability", *ASPDAC,* 2004, pp. 218-233. In Smith's error-diagnosis technique, two types of components are added to a given buggy netlist. These components include (1) multiplexers, and (2) an error-cardinality constraint. The purpose of the multiplexers is to model errors—when their select lines are asserted, alternative sources drive the corresponding internal wires to correct the output responses. The number of asserted select lines is limited by the error-cardinality constraint, which is implemented as an adder and a comparator: the adder counts the number of asserted select lines, and its output is forced to a value N using the comparator. The circuit is then converted into Conjunctive Normal Form (CNF), and inputs and outputs are subjected to additional constraints from input vectors and correct output responses, obtained from a high-level model. Error diagnosis is then performed by iteratively solving the CNF using a SAT solver with an increasing value for N, until a solution is found. This Smith's technique diagnoses errors in combinational circuits only; to diagnose sequential circuits, others (namely Ali et al., "Debugging Sequential Circuits Using Boolean Satisfiability", *ICCAD,* 2004, pp. 44-49) have extended Smith's work by unrolling the circuit, before the CNF conversion step, M times, where M is the sequential length of the given trace. Similar approach is used in our synthesis-based diagnosis.

Logic and Symbolic Simulation—Logic simulation models the behavior of a digital circuit by propagating scalar Boolean values (0 and 1) from primary inputs to primary outputs. For example, when simulating 2-input AND with both inputs set to 1, the output 1 is produced. On the other hand, symbolic simulation uses symbols instead of scalar values and produces Boolean expressions at the outputs. As a result, simulating a 2-input XOR with inputs a and b generates an expression "a XOR b" instead of a scalar value. To improve scalability, modern symbolic simulators employ several techniques, including approximation, parameterization and on-the-fly logic simplification. For example, with on-the-fly logic simplification, "0 XOR b" is simplified to b thus reducing the complexity of the expression. Traditional symbolic simulators operate on a gate-level model of a design; however, in recent years simulators operating on RTL descriptions have been proposed.

Signature-based Resynthesis Techniques—The framework discussed herein may include error repair in addition to error diagnosis. An example of an error repair technique is from the CoR'e framework described by Chang et al., "Fixing Design Errors with Counterexamples and Resynthesis", *ASP-DAC,* 2007, pp. 944-949, which models a combinational netlist as a multi-level Boolean network and strives to correct design errors by resynthesizing the sites responsible for erroneous behavior, using information from other nodes in the network. To support error correction, they propose two resynthesis techniques, Entropy-Guided Search (EGS) and Goal-Directed Search (GDS). EGS performs resynthesis by identifying suitable inputs and constructing a truth table using the identified inputs, while GDS performs exhaustive search for resynthesis functions using branch and bound. Their techniques use only signatures of nodes, where the bits in a signature are the simulation values of the given test vectors. A signature is essentially a node's partial truth table and represents a node's behavior. Given a set of candidate signatures and a target signature, these techniques can find resynthesis functions that generate the target signature using the candidates.

Whether from a synthesis-based diagnosis, a simulation-based diagnosis, or a combination of both running simultaneously, the present techniques describe a computer executable framework that facilitates integrated circuit design and debugging by working directly at the Register Transfer Level, where most design activities take place. The framework may be executed in software or as an integrated circuit or other application in hardware. The framework determines when an integrated circuit design produces incorrect output responses for a given set of input vectors by comparing the actual responses with the expected responses. The framework accesses the expected responses and returns the signal paths in the integrated circuit that are responsible for the errors along with suggested changes for fixing the errors. The framework may operate at the RTL, which is above the gate level abstraction which means that the design errors will be much more readily understood to the designer, and may improve scalability and efficiency.

In accordance with one aspect of the disclosure, a method of diagnosing erroneous behavior of node outputs in a register transfer level (RTL) design containing one or more RTL modules, comprises converting each RTL module to an enriched RTL module having one or more conditional states that each may take the form of different values; identifying an incorrect node output from the RTL design; and adjusting at least one of the conditional states in the enriched RTL modules to correct the incorrect node output from the RTL design.

In some examples, a method of diagnosing erroneous behavior of node outputs in a Register Transfer Level (RTL) design containing one or more RTL modules, the method comprises: converting each RTL module to an enriched RTL module having one or more conditional states that each may take the form of different values, wherein converting each RTL module to an enriched RTL module comprises performing an insertion of a conditional assignment on at least one RTL variable in each RTL module; identifying an incorrect node output from the one or more RTL modules; and adjusting at least one of the conditional states of the enriched RTL modules by adjusting at least one select variable of the enriched RTL modules to correct the incorrect node output from one or more of the RTL modules.

In accordance with another aspect of the disclosure, a method of debugging an integrated circuit design expressed through Register Transfer Level (RTL) modules producing intermediate node outputs respectively, comprises determining which of the RTL modules have intermediate node outputs resulting in an incorrect output data; modifying the RTL modules resulting in an incorrect output data with a selectable RTL variable; and adjusting the selectable RTL variable of at least one of the RTL modules until correct output data results.

In accordance with another aspect of the disclosure, an article a computer-readable medium having stored thereon instructions that, when executed by a computer, cause the computer to: convert register transfer level (RTL) modules of an RTL design to enriched RTL modules each having one or more conditional states that may each take the form of different values; identify an incorrect node output from the RTL modules; and adjust at least one conditional state of the enriched RTL modules to correct the incorrect node output from the RTL modules.

In some examples, an article comprising a computer-readable medium having stored thereon instructions that, when executed by a computer, cause the computer to: convert Register Transfer Level (RTL) modules of an RTL design to enriched RTL modules each having one or more conditional states that may each take the form of different values, wherein said conversion comprises inserting a conditional assignment on at least one RTL variable in each RTL module, wherein each conditional assignment contains a select variable that may be adjusted to change the conditional state of the respective enriched RTL module; identify an incorrect node output from the RTL modules; and adjust at least one of the conditional states of the enriched RTL modules by adjusting at least one of the select variables to correct the incorrect node output from the RTL modules.

In accordance with another aspect of the disclosure, for debugging an integrated circuit design expressed through Register Transfer Level (RTL) modules producing intermediate node outputs respectively, an article comprises a computer-readable medium having stored thereon instructions that, when executed by a computer, cause the computer to determine which of the RTL modules have intermediate node outputs resulting in incorrect output data; modify the RTL modules resulting in the incorrect output data with a selectable RTL variable; and adjust the selectable RTL variable of at least one of the modified RTL modules until correct output data results.

These node outputs may be internal node outputs from one of the RTL modules forming the RTL design or the outputs of Boolean expressions using RTL module node outputs as inputs thereto.

BRIEF DESCRIPTION OF THE DRAWING FIGURES

For a more complete understanding of the disclosure, reference should be made to the following detailed description and accompanying drawing figures, in which like reference numerals identify like elements in the figures, and in which:

FIG. 2 illustrates an example conversion of an RTL module to an enriched RTL module having a conditional assignment in an example implementation;

FIG. 3 illustrates an example algorithm for inserting a conditional assignment in an RTL module;

FIG. 4 illustrates an example algorithm for performing error diagnosis using synthesis and circuit unrolling;

FIG. 5 illustrates an example algorithm for performing error diagnosis using symbolic simulation;

FIG. 6 illustrates an example circuit containing an error in an RTL module and an enriched RTL model that may be used to correct the incorrect output from the RTL module; and FIG. 7 illustrates a signature-construction example in accordance with an example.

FIG. 8 illustrates Table 1 which lists characteristics of benchmarks in an example implementation;

FIG. 9 illustrates Table 2 which provides a description of bug inserted into the benchmarks in an example implementation;

FIG. 10 illustrates Table 3 which illustrates synthesis-based error diagnosis results in an example implementation;

FIG. 11 illustrates Table 4 which illustrates error correction results in an example implementation;

Figure 1:
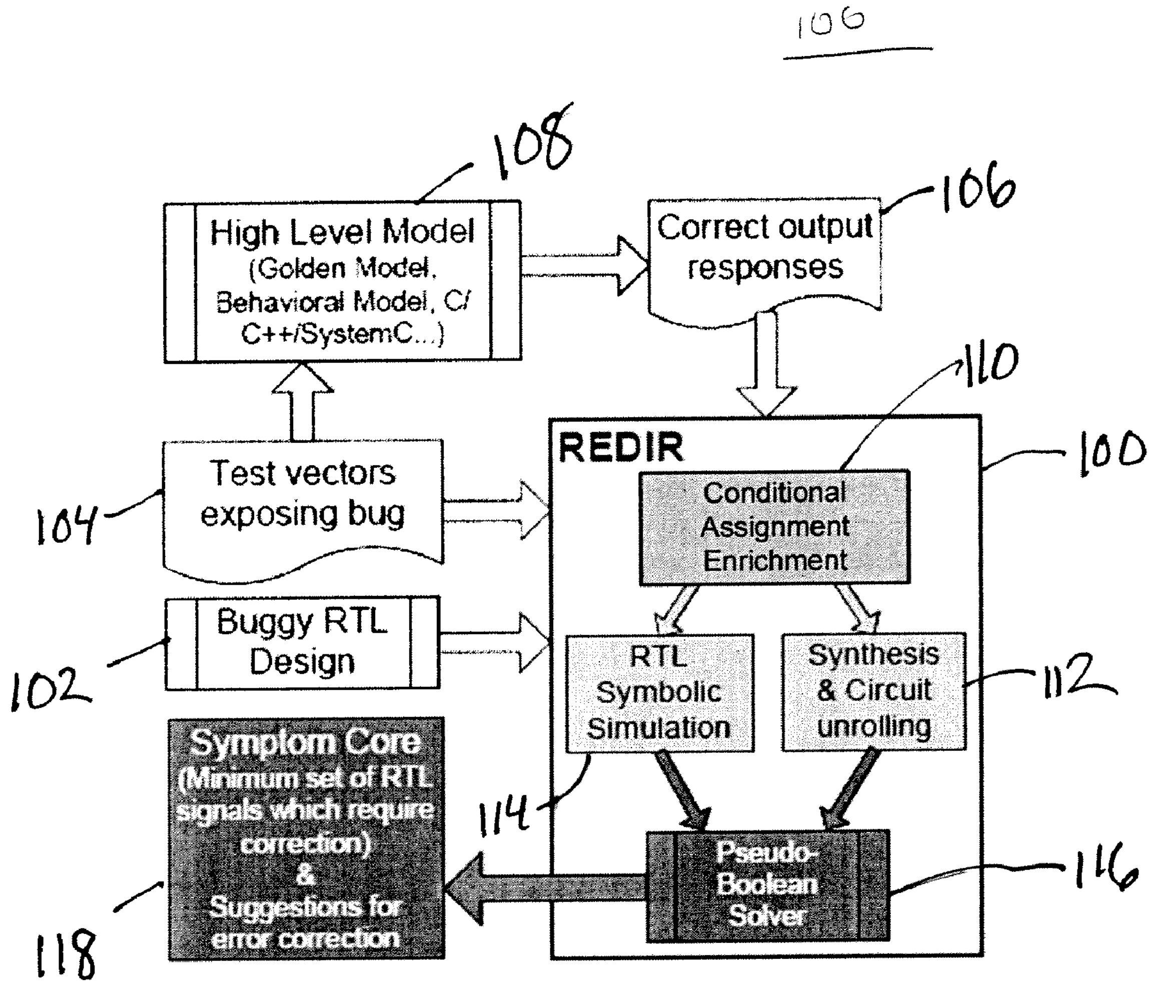
FIG. 1 is a block diagram of a RTL level error model and diagnosis tool in accordance with an example.

While the disclosed methods and apparatus are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

Various techniques are described herein for achieving debugging at the RTL. These techniques generally include: (1) a RTL error model based on conditional assignment insertion; (2) error-diagnosis algorithms using synthesis or symbolic simulation; and (3) an error-correction technique using node behaviors (signatures) that is especially suitable for the RTL. The RTL error model differs from existing debugging techniques in numerous ways that will be apparent to persons of ordinary skill in the art. Conventional techniques are based on software analysis approaches and use MUXes implicitly to identify erroneous statements in the HDL code. On the other hand, the present techniques take a hardware analysis approach by explicitly inserting conditional assignments into the HDL code to identify erroneous signals. This approach allows us to provide significantly more accurate diagnoses than previous RTL solutions because we can analyze designs rigorously using formal hardware verification techniques. As we demonstrate, our techniques are also more precise and more efficient than existing gate-level diagnosis techniques. In addition, identifying RTL errors using gate-level results is difficult. The techniques of the instant application may be implemented in a framework 100 called REDIR (RTL Error Diagnosis and Repair), shown in FIG. 1.

The inputs to the framework 100 include an RTL design 102 containing one or more bugs, a set of test vectors 104 exposing these bugs, and a set of correct output responses 106 for the RTL modules forming the design 102. These correct outputs may be for the primary outputs over the given test vectors and may be generated by a high-level behavioral model 108. By way of example, the model 108 may be written in C, C++, SystemC, or similar languages. The framework 100 may operate based on the correct responses at the primary outputs of the high-level model, without need for the correct values of the internal values. Thus, the framework 100 may operate from knowing the correct output responses to the primary outputs, without needing to know the correct output responses for each RTL module in the design 102. In other examples, the framework 100 may operate by knowing various of the internal node output values for particular RTL modules and assessing these node outputs to determine if the corresponding RTL modules are producing the desired result.

The output of the framework 100 may be a minimum cardinality set of RTL module signals that should be corrected in order to eliminate erroneous behavior in the design 102. The set of RTL module signals that should be corrected is termed the symptom core, or the set of incorrect RTL module signals. It is noted that there may be numerous different sets of RTL module signals that may be corrected to correct the erroneous code. Some of these solutions may require the adjustment of more RTL module signals than others of these solutions. The solutions that require the least number of adjustments would be considered the minimum symptom core. There may be several minimum symptom cores, if multiple solutions require the same number of adjustments to the RTL module signals.

When multiple cores exist, REDIR framework 100 provides all of the possible minimal cardinality sets. In addition, the framework may suggest several possible fixes of the signals in the symptom core to help a designer correct those signals. The framework 100 does not require a formal design specification and relies only on the availability of simulation test vectors. Moreover, the framework 100 supports both combinational and sequential designs; therefore, it can be applied to any mainstream verification flow. In addition, it is more scalable than gate-level approaches as indicated in our experimental results. Some example implementations can diagnose and correct multiple errors in design descriptions with thousands of lines of Verilog code (or approximately 100K cells after synthesis). Compared with state-of-the-art gate-level diagnosis techniques, the REDIR framework 100 may be more than 100× faster in most cases and may be able to diagnose more bugs with higher accuracy. In contrast with existing RTL diagnosis methods that only provide potential error lists, the REDIR framework 100 is significantly more accurate and can point out the exact signals responsible for the errors along with possible fixes.

1. RTL Error Diagnosis

The initial part of RTL design error diagnosis is establishing an RTL error model which is done at a conditional assignment enrichment circuit 110 within the framework 100. Next two diagnosis methods may be used that either synthesize (block 112) or symbolic simulate (block 114) the enriched RTL modules from the circuit 110.

RTL Error Modeling

In the framework 100, the error-diagnosis problem is represented with (1) an RTL description containing one or more bugs that is composed of variables (wire, registers, I/O) and operations on those variables; (2) a set of test vectors exposing the bugs; and (3) the correct output responses for the given test vectors, usually generated by a high-level behavioral model. The objective of the error diagnosis is to identify a minimal number of variables in the RTL description that are responsible for the design's erroneous behavior. Moreover, by modifying the logic of those variables, the design errors can be corrected.

Each RTL module signal found to affect the correctness of the design may be considered a symptom variable, or set of RTL module variables that when adjusted will result in the correct output response. Without minimization, the set of symptom variables reported would include the root cause of the bug and the cone of logic emanating from it: correcting all the symptom variables on any cut across this cone of logic would eliminate the bug. Therefore, by forcing a PB solver 116 to minimize the number of symptom variables and communicate those to a symptom core circuit 118 that may return a solution as close to the root cause of the erroneous behavior as possible.

To model errors in a design, each RTL module in the design 102 may be converted to an enriched RTL module by introducing a conditional assignment for each RTL variable at the circuit 110. FIG. 2 shows an example. Each RTL design 102 may be formed of numerous RTL modules, some of which may operate incorrectly and some of which may operate correctly. FIG. 2 shows one RTL module 200 (in this example a half adder) and a corresponding enriched RTL module 202 having conditional assignments that have been added to the RTL module 200. The RTL module 200 includes input vectors 204 and output vectors 206. The enriched RTL module 202 includes these same input and output vectors, but also includes conditional assignment variables 208, illustrated in bold. Typically, these conditional assignments would be used for error diagnosis and would not appear in the final synthesized design. The conditional assignments allow the REDIR framework 100 to locate sites of erroneous behavior in RTL design 102.

For the illustrated example, suppose that the output responses of the design are incorrect because c should be driven by "a & b" instead of "a|b", for example through programmer error. That is output c (210) is a bad RTL module variable. Obviously, to produce the correct output that we obtain from a high-level model (such as the model 102), the behavior of c must be changed. To model this situation, the framework 100 inserts a conditional assignment, "assign $c_n=c_{sel}$ ? $c_f$:c", into the code of the RTL module 200. The assignment is equivalent to (if ($c_{sel}$==1) then $c_n=c_f$; else $c_n$=c. Next, the framework 100 replaces all occurrences of c in the RTL module code with $c_n$, except when c is used on the left-hand-side of an assignment. In the illustrated example, $c_{sel}$ is a select variable and $c_f$ is a free variable. By asserting the select variable $c_{sel}$ and using an alternative signal source, modeled by $c_f$, the framework 100 can force the circuit to behave as desired. When the framework 100 identifies the select variables that should be asserted and the correct signals that should drive the corresponding free variables to produce correct circuit behavior, the framework 100 will have diagnosed and fixed the errors in the design.

The procedure performed by block 110 to introduce a conditional assignment for a design variable v is called conditional assignment-enrichment and an example of its pseudocode is shown in FIG. 3. It may be performed on each internal signal, defined in the circuit, including registers. The primary inputs, however, need not be conditional-assignment enriched since by construction they cannot have erroneous values. It also should be noted that for hierarchical designs the primary inputs of a module may be driven by the outputs of another module and, therefore, may assume erroneous values. To handle this situation, we insert conditional assignments into the hierarchical modules' output ports.

For example, each RTL variable may be assigned to have a select variable and a free variable, where the select variable turns on the conditional assignment in one state and turns it off in another. Other types of select variables may be used instead. This assignment creates an enriched RTL variable (or more broadly module). After adding the conditional assignment, all occurrences of the RTL variable that appear on the right-hand-side of the assignment are replaced with the enriched RTL variable to form the error model. This routine may be applied to each of the RTL variables in each of the RTL modules, or in RTL variables in an identified subset of the RTL modules.

Diagnosis with Synthesis

After the error-modeling constructs (e.g., conditional assignments) have been inserted into a design, error diagnosis is used to identify the minimal number of select variables that should be asserted along with the values of their corresponding free variables to produce the correct circuit behavior. The select variables and free variables correspond to particular RTL module variables, therefore identification of particular select variables and free variables will result in identification of the RTL module signals that must be changed.

There are numerous ways in which to perform diagnosis. One type of error diagnosis technique is implemented using the synthesis and circuit unrolling (block 112 of FIG. 1). In contrast with existing gate-level diagnosis techniques described above, the RTL error modeling constructs are synthesized with the design, which eliminates the need to insert multiplexers at the gate level. In this way, the synthesized netlist faithfully preserves the constructs inserted at the RTL, enabling accurate RTL error diagnosis. This is significantly different from diagnosing design errors at the gate level, since synthesis is only used to generate Boolean expressions between RTL variables, and the synthesized netlist is not the target of the diagnosis. As a result, the present diagnosis techniques have a much smaller search space and run significantly faster than gate-level techniques.

FIG. 4 outlines an example algorithm that may be used for synthesis-based error diagnosis in the synthesizer 112. Before the procedure is called, the design is synthesized and its combinational portion is converted to CNF format (designCNF). Other inputs to the procedure include the length of the bug trace, c, as well as the test vectors (inputs) and their correct output responses (outputs). To make sure that the diagnosis applies to all simulation cycles, the algorithm connects the select variables for each unrolled copy to the corresponding CNF variables in the first copy. On the other hand, free variables for each unrolled copy of the circuit are independent. When a solution is found, each asserted select variable is a symptom variable, and the solution for its corresponding free variable is an alternative signal source that can fix the design errors. Note that if state values over time are known, they can be used to constrain the CNF at register boundaries, reducing the sequential error-diagnosis problem to combinational. The constructed CNF, along with the objective to minimize the sum of select variables, forms a Pseudo-Boolean Constraint (PBC). Error diagnosis is then performed in the solver 116 by solving this PBC.

Diagnosis with Symbolic Simulation

Another type of diagnosis may be achieved through symbolic simulation (block 114 from FIG. 1). The simulator 114 may perform symbolic simulation directly on the RTL representation and generate Boolean expressions at the primary outputs for all simulated cycles. The outputs' Boolean expressions are used to build a Pseudo-Boolean problem's instance, that is then handed over to a PB solver 116 for error diagnosis. FIG. 5 illustrates an example algorithm that uses symbolic simulation (block 114) and PB solving (block 116).

We assume that the registers are initialized to known values before the procedure is invoked. We also assume that the circuit contains n conditional assignment-enriched signals named $v_i$, where i={1 . . . n}. Each $v_i$ has a corresponding select variable $v_{i\_sel}$ and a free variable $v_{i\_f}$. There are o primary outputs, named $PO_j$, where j={1 . . . o}. The subscript "@" is used to prefix the cycle during which the symbols are generated. For each primary output j and for each cycle t we compute expression $PO_{j@t}$ by symbolically simulating the given RTL design, and also obtain correct output value $CPO_{j@t}$ from the high-level model. The inputs to the procedure are the RTL design (design), the test vectors (test vectors), and the correct output responses over time (CPO).

In the algorithm shown in FIG. 5, a symbol is initially created for each select variable (line 1). During the simulation, a new symbol is created for each free variable in every cycle, and test vectors are applied to primary inputs, as shown in lines 2-4. The reason for creating only one symbol for each select variable is that a conditional assignment should be either activated or inactivated throughout the entire simulation, while each free variable requires a new symbol at every cycle because the value of the variable may change. As a result, the symbols for the select variables are assigned outside the simulation loop, while the symbols for the free variables are assigned in the loop. The values of the free variables can be used as the alternative signal source to produce the correct behavior of the circuit. After simulating one cycle, a Boolean expression for all of the primary outputs are created and saved in $PO_{@t}$ (line 5). After the simulation completes, the generated Boolean expressions for all the primary outputs are constrained by their respective correct output values and are ANDed to form a PBC problem as line 7 shows. In order to minimize the number of symptom variables, the sum of select variables is minimized, which is also added to the PBC as the objective function. The PB solver 112 is then invoked to solve the formulated PBC, as shown in line 8.

In these examples, the asserted select variables represent the symptom variables, and the values of the free variables represent the alternative signal sources that can be used to correct the erroneous output responses. Below is an example of a buggy design to illustrate the symbolic simulation-based error-diagnosis technique.

Example 1

Assume that the circuit shown (RTL module) in FIG. 6 contains an error: signal g1 is erroneously assigned to expression "r1|r2" instead of "r1 & r2". Conditional assignments, highlighted in boldface, have been inserted into the circuit using the techniques described above. For simplicity reasons, the MUXes at the outputs of registers r1 and r2 are not included. The trace that exposes the error in two simulation cycles consists of the following values for inputs {I1, I2}: {0, 1}, {1, 1}. When the same trace is simulated by a high-level behavioral model, the correct output responses for {O1, O2} are generated: {0, 0}, {1, 0}. Besides these output responses, no addition information, such as values of internal signals and registers, is required. We annotate the symbols injected during the simulation by their cycle numbers using subscripts. The Boolean expressions for the primary outputs for the two cycles of simulation are:

$$O1_{n@1}=O1_{sel}?O1_{f@1}:[I1_{@1}|(g1_{sel}?g1_{f@1}:0)]$$

$$O2_{n@1}=O2_{sel}?O2_{f@1}:[I2_{@1}\&(g1_{sel}?g1_{f@1}:0)]$$

$$O1_{n@2}=O1_{sel}?O1_{f@2}:\{I1_{@2}|[g1_{sel}?g1_{f@2}:(I1_{@1}\&I2_{@1})]\}$$

$$O2_{n@2}=O2_{sel}?O2_{f@2}:\{I2_{@2}\&[g1_{sel}?g1_{f@2}:(I1_{@1}\&I2_{@1})]\}$$

Since the primary inputs are scalar values, the expressions can be greatly simplified during symbolic simulation. For example, we know that $\mathbf{I1}_{@2}=1$; therefore, $\mathbf{O1}_{n@2}$ can be simplified to $\mathbf{O1}_{sel}?\mathbf{O1}_{f@2}:1$. As a result, the Boolean expressions actually generated by the symbolic simulator are:

$$O1_{n@1}=O1_{sel}?O1_{f@1}:(g1_{sel}?g1_{f@1}:0)$$

$$O2_{n@1}=O2_{sel}?O2_{f@1}:(g1_{sel}?g1_{f@1}:0)$$

$$O1_{n@2}=O1_{sel}?O1_{f@2}:1$$

$$O2_{n@2}=O2_{sel}?O2_{f@2}:(g1_{sel}?g1_{f@2}:0)$$

To perform error diagnosis, we constrain the output expressions using the correct responses, and then construct a PBC as follows:

$$PBC=(O1_{n@1}=0)\text{ AND }(O2_{n@1}=0)\text{ AND }(O1_{n@2}=1)\text{ AND }(O2_{n@2}=0),\min(O1_{sel}+O2_{sel}+g1_{sel}).$$

One possible solution of this PBC is to assert $g1_{sel}$, which provides a correct symptom core.

Handling Hierarchical Designs

Current circuit designs often have hierarchical structures to allow the circuit to be decomposed into smaller blocks and thus reduce its complexity. The conditional assignment-enriched circuit techniques herein may be instantiated if it is encapsulated as a module in such a hierarchical design.

The algorithm to insert conditional assignments into a single module m is shown in FIG. 3. If m is instantiated inside of another module M, however, conditional assignment-enrichment of M must include an extra step where new inputs are added to all instantiations of m. Therefore, for hierarchical designs, the insertion of conditional assignments is performed bottom-up: conditional assignment-enrichment in a module is executed before it is instantiated by another module. This is achieved by analyzing the design hierarchy and performing conditional assignment-enrichment in a reverse-topological order.

It is important to note that in hierarchical designs, the select variables of instances of the same module may be shared, while typically the free variables should not be shared. This is because all instances of the same module will have the same symptom variables. As a result, select variables should share the same signals. On the other hand, each instance is allowed to have different values for their internal signals; therefore, each free variable should have its own signal.

2. RTL Error Correction

Generally speaking, the RTL error-correction problem is formulated as follows: given an erroneous RTL description of a digital design, find a variant description for one or more of the modules (e.g., RTL modules) that compose the error so that the new design presents a correct behavior for the errors, while leaving the known-correct behavior (e.g., correct RTL modules) unchanged.

Although many error-repair techniques exist for gate-level designs, very few studies focus on the RTL. One major reason is the lack of logic representations that can support the logic manipulation required during RTL error correction. In Chang et al., "Fixing Design Errors with Counterexamples and Resynthesis", *ASPDAC,* 2007, pp. 944-949, a framework has been proposed for gate-level error correction. The authors' approach utilizes only signatures, which can be easily calculated via simulation, making their techniques especially suitable for RTL error correction. However, they only applied their techniques to combinational circuits, and they cannot handle design hierarchies. To support the error-correction requirements at the RTL, where most designs contain hierarchies and are sequential, we propose a new error-correction scheme based on similar concepts. The baseline error-correction technique is first described, following that a description of how signatures may be generated at the RTL module to handle hierarchical and sequential designs.

Baseline Error Correction Technique

For a flattened combinational design, error correction may be performed as follows: (1) signatures of the RTL variables within an RTL module are generated using simulation; (2) error diagnosis is performed to find a symptom core which represents the RTL modules with erroneous symptom (RTL) variables; (3) signatures of the symptom (RTL) variables in the symptom core are replaced by the values of their corresponding free variables; and (4) logic synthesis (or resythesis) is applied (as discussed above) to find logic expressions generating the signatures of the symptom variables. By replacing the expressions that generate the functions of the symptom variables with those new expressions, design errors can be corrected.

Hierarchical and Sequential Designs

In a flattened design, each RTL variable represents exactly one logic function. In a hierarchical design, however, each variable may represent more than one logic function. Therefore, we devise the following techniques to construct the signatures of RTL variables. For clarity, we call a variable in an RTL module a module variable and a variable in an instance generated by the module an instance variable. A module variable may generate multiple instance variables if the module is instantiated several times.

In RTL error correction, the framework 100 modifies the source code of the modules in order to correct the design's behavior. Since changing an RTL module will affect all the instances produced by the module, the framework 100 concatenates the simulation values of the instance variables derived from the same module variable to produce the signature for the module variable. This way, the framework 100 can guarantee that a change in a module will affect its derived instances in the same way. Similarly, framework 100 concatenates the signatures of the module variable at different cycles for sequential error correction. A signature-construction example is given in FIG. 7. Note that to ensure the correctness of error repair, the same instance and cycle orders must be used during the concatenation of signatures for all module variables.

Example 2

Using the same circuit as Example 1, the values returned by the PB solver for $g1_{f@0}$ and $g1_{f@1}$ are both 0. Since the inputs to g1 are {0, 0} and {0, 1} for the first two cycles, RTL error correction returns the following new logic expressions that can fix the error: g1=r1&r2, g1=r1, etc. Note that although the correct fix is returned, the fix is not unique. In general, longer traces containing various test vectors will identify the error with higher precision and suggest better fixes than short ones.

Fixing errors involving multi-bit variables is more difficult than fixing errors involving only one-bit variables because different bits in the variable may be generated differently. To solve this problem, the framework 100 may allow the user to insert a conditional assignment for each bit in the variable. Alternatively, the framework 100 can also be configured to consider only the least-significant bit when performing error correction. This is useful when the variable is considered as a whole.

3. Example Simulation Results

In example experiments, we evaluated the performance of the techniques herein with a range of Verilog benchmarks. We used a proprietary Perl-based Verilog parser to insert conditional assignments into RTL code. Synthesis-based diagnosis was implemented using OAGear 0.96 and OpenAccess 2.2 from Silicon Integration Initiative, Inc. with RTL Compiler v4.10 from Cadence as the synthesis tool. For simulation-based diagnosis, we adopted an experimental RTL symbolic simulator, Insight 1.4, from Avery Design Systems, Inc. For efficiency, we implemented the techniques described in Eén et al., "An extensible SAT-solver," in Proc. Theory and Applications of Satisfiability Testing, 2003, pp. 502-518 to convert PB problems to SAT problems and adopted MiniSAT as our SAT solver, which was implemented using that described in Eén et al., "An extensible SAT-solver," in Proc. Theory and Applications of Satisfiability Testing, 2003, pp. 502-518. All the experiments were conducted on an AMD Opteron 880 (2.4 GHz) Linux workstation with 16 GB memory. The designs under test included several circuits selected from OpenCores (Pre_norm, MD5, MiniRISC, and CF_FFT), the picoJava-II microprocessor (Pipe), and proprietary microprocessor designs DLX and Alpha.

Bugs (described in Table 2 see FIG. 9) were injected into these benchmarks except DLX and Alpha, which already included bugs. We used constrained-random simulation to generate bug traces for Pipe, Pre_norm, and CF_FFT, while the bug traces for the rest of the benchmarks were generated using the verification environment shipped with the designs. Traces to expose bugs in DLX and Alpha were given by the verification engineer and were generated using a constrained-random simulation tool. The characteristics of these benchmarks are summarized in Table 1 of FIG. 8.

In Table 1, "RTL #Lines" is the number of lines of RTL code in a design, and "Gate-level #Cells" is the cell count of the synthesized netlist. To compare our results with previous work, we implemented the algorithms for gate-level error diagnosis in Ali et al., "Debugging Sequential Circuits Using Boolean Satisfiability", *ICCAD,* 2004, pp. 44-49 and Smith et al., "Design Diagnosis Using Boolean Satisfiability", *ASP-DAC,* 2004, pp. 218-223. In the table, we list the number of MUXes inserted by their techniques in column "#MUXes", and the number of conditional assignments under "#Assign". Note that MUXes and conditional assignments are conceptually similar; however, MUXes operate at the gate-level while conditional assignments are for the RTL.

Synthesis-Based Error Diagnosis

In this experiment, we performed combinational and sequential error diagnosis using the synthesis-based techniques described above. For comparison with previous work, we also synthesized the benchmarks and performed gate-level error diagnosis using Smith's and Ali's techniques described above. The results are summarized in Table 3 (FIG. 10). Recall that a symptom core suggests a possible set of signals to modify for correcting the design, and it includes one or more symptom variables. In all our experiments, we found that the reported symptom cores included the root causes of errors. In other words, the REDIR framework 100 accurately pointed out the signals that exhibited erroneous behavior.

Comparison Between RTL and Gate-Level Error Diagnosis

This comparison clearly indicates that diagnosing functional errors at the RTL module has significant advantages over the gate level: shorter runtime and more detection power. As Table 3 shows, most errors can be diagnosed using our techniques within a few minutes, while identifying the same errors at the gate level takes more than 48 hours in many cases. One major reason for this is that the number of possible symptom variables (error sites), i.e., internal netlist nodes responsible for the bug, is significantly smaller in RTL diagnosis, as can be observed from the numbers of inserted conditional assignments shown in Table 1. This is due to the fact that one simple RTL module may be synthesized into a complex netlist, which proliferates the number of error sites. For example, a statement like "a=b+c" creates only one symptom variable at the RTL. Its synthesized netlist, however, may contain hundreds of error sites, depending on the implementation of the adder and the bit-width of the signals. The small number of potential symptom variables at the RTL significantly reduces the search space for PB or SAT solvers and provides very short diagnosis runtime. In addition, one bug at the RTL may transform into multiple simultaneous bugs at the gate level. Since runtime of error diagnosis grows substantially with each additional bug, being able to diagnose errors at the RTL avoids the expensive multi-error diagnosis process at the gate level.

We also observed that although the runtime of the RTL error diagnosis still increases with each additional bug, its growth rate is much smaller than the growth rate at the gate level. For example, as Table 3 shows, the runtime of the gate-level diagnosis for Pre_norm(A) and (D), which combined (A) and (B), was 63.6 and 88.7 seconds, respectively. For RTL diagnosis, the runtime was 13.2 and 13.8 seconds, respectively.

Comparison Between Combinational and Sequential Diagnosis

The difference between combinational and sequential diagnosis is that sequential diagnosis only uses output responses for constraints, while combinational is allowed to use state values. As Table 3 shows, the runtime of combinational diagnosis is typically shorter, and the number of symptom cores is often smaller. In DLX(D), for example, the combinational technique runs significantly faster than sequential, and returns only three cores, while sequential returns nine. The reason is that combinational diagnosis allows the use of state values, which provide additional constraints to the PB instance. As a result, a PB solver can find solutions faster, and the additional constraints further localize the bugs. Being able to utilize state values is especially important for designs with very deep pipelines, where an error may be observed hundred cycles later. For example, the error injected into CF FFT requires more than 40 cycles to propagate to any primary output, making the use of sequential diagnosis difficult. In addition, bugs that are observed in design states can only be diagnosed when state values are available, such as DLX(G). On the other hand, sequential diagnosis is important when state values are unavailable. For example, the bug injected into the MiniRISC processor changed the state registers, damaging correct state values. In practice, it is also common that only responses at primary outputs are known. Therefore, being able to diagnose errors in combinational and sequential circuits is equally important, and both are supported by the REDIR framework. The comparison between MD5(B) and MD5(C) shows that there is a trade-off between diagnosis runtime and quality: MD5(C) uses a shorter trace and thus requires shorter diagnosis runtime; however, the number of symptom cores is larger than that returned by MD5(B), showing that the results are less accurate. The reason is that longer traces usually contain more information; therefore, they can better localize design errors. One way to obtain short yet high-quality traces is to perform bug trace minimization before error diagnosis. Such minimization techniques can remove redundant information from the bug trace and greatly facilitate error diagnosis. Various techniques for minimization will be known, including that described in Chang et al., "Simulation-based Bug Trace Minimization with BMC-based Refinement", *ICCAD,* 2005, pp. 1045-1051 to minimize the traces for DLX and Alpha. The length of the original traces produced by a constrained-random generator is shown in parentheses. In general, one trace is enough to localize the errors to a small number of symptom cores, and more traces may further reduce this number.

Simulation-Based Error Diagnosis

In this example, the framework 100 was used to perform simulation-based diagnosis using the algorithm with Insight, an experimental RTL symbolic simulator from Avery Design Systems, Inc. Benchmarks Pipe and CF FFT were used in this experiment. Simulation took 23.8 and 162.9 seconds to generate SAT instances for these benchmarks, respectively. The SAT solver included in Insight then solved the instances in 1 and 723 seconds respectively, and it successfully identified the design errors. Although the runtime of simulation-based approach is longer than the synthesis based method, it does not require the design to be synthesized in advance, thus saving the synthesizer runtime.

Error Correction

In the example of error-correction, the framework 100 applied the techniques described above (in the RTL error correction section) to fix the errors diagnosed in Table 3. Combinational diagnosis was used in this example, and the results are summarized in Table 4 (FIG. 11). In the table, "#Cores fixed" is the number of symptom cores that can be corrected using our error-correction techniques, and "#Fixes" is the number of ways to fix the errors. The framework 100 applied GDS first in the experiment, and observed that GDS often returns a large number of valid fixes that can correct the design errors. One reason is that GDS performs exhaustive search to find new logic expressions; therefore, it may find many different ways to produce the same signal. For example, "A AND B'" and "A AND (A XOR B)" are both returned even though they are equivalent. Another reason is that the experiment was conducted, in this example, to only diagnose short bug traces, which may produce spurious fixes: signatures of different variables are the same even though their functions are different. As a result, only the first 100 fixes of the implementation are reported, where the fixes are sorted so that those with smaller number of gates are returned first. Due to the exhaustive-search nature of GDS, memory usage of GDS may be high during the search, as are the cases for benchmarks DLX (C-F) and Alpha. In these benchmarks, GDS ran out of memory, and we relied on EGS to find fixes that can correct the errors. Since EGS only returns one logic expression when fixing an error, the number of possible fixes is significantly smaller. Table 4 shows that valid fixes were not found for benchmarks MD5(B) and DLX(A). The reason is that the bugs in these benchmarks involve multi-bit variables. For example, bug MD5(B) is an incorrect state transition for a 3-bit state register. Because this example only considered the least-significant bits of such variables during error correction, the example did not find a valid fix. Of course, in accordance with the teachings herein, a conditional assignment could be inserted for every bit in a multi-bit variable to address this issue.

The error-diagnosis results show that the present error modeling construct and diagnosis techniques can effectively localize design errors to a small number of symptom variables. On the other hand, our error-correction results suggest that options to repair the diagnosed errors abound. The reason is that the search space of error correction is much larger than error diagnosis. Numerous solutions may be used to fix a single incorrect RTL module in an integrated circuit design. Thus, finding high quality fixes for a bug requires much more information than providing high-quality diagnoses. Although this can be achieved by diagnosing longer or more numerous bug traces, the runtime of the REDIR framework will also increase.

To reduce debugging time, in some examples, the error correction techniques can be used to facilitate manual error repair. For example (1) the engineer fixes the RTL code manually to provide new logic functions for the symptom cores identified by error diagnosis; and (2) the REDIR framework simulates the new functions to check whether the signatures of symptom cores can be generated correctly using the new functions. If the signatures cannot be generated by the new functions, then the fix is invalid. In this way, engineers can verify the correctness of their fixes before running verification, which can accelerate the manual error-repair process significantly.

Experiments were applied to designs as large as 127K cells with traces that can be hundred-cycles long, which are more than 10× larger than the benchmarks reported in conventional RTL error-diagnosis literature. The present techniques can be applied to more complex designs than existing solutions are able to address.

Figure 12:
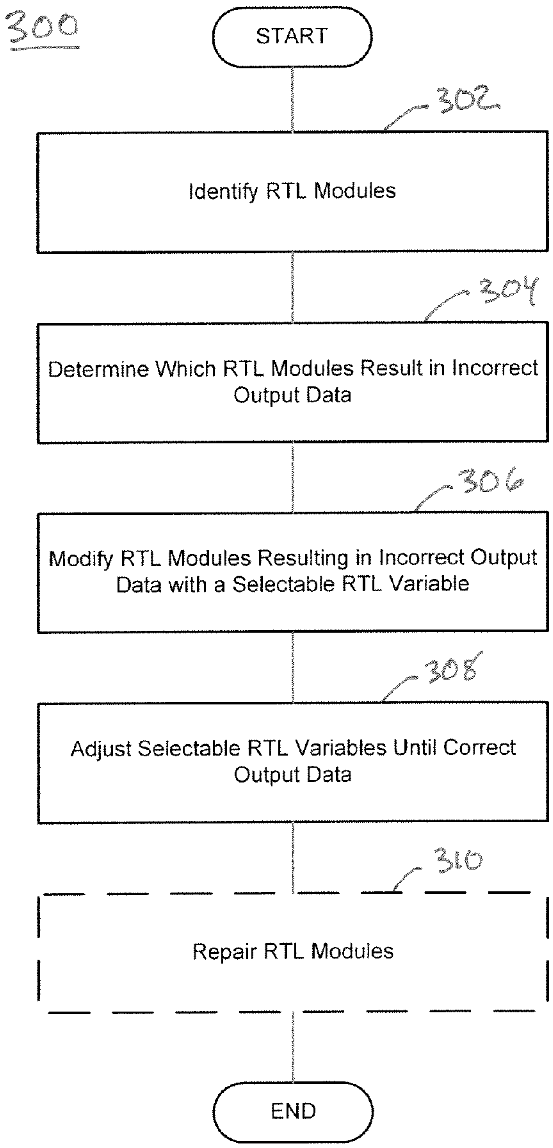
FIG. 12 illustrates a technique for RTL level diagnosis and correction in accordance with an example.
Figure 13:
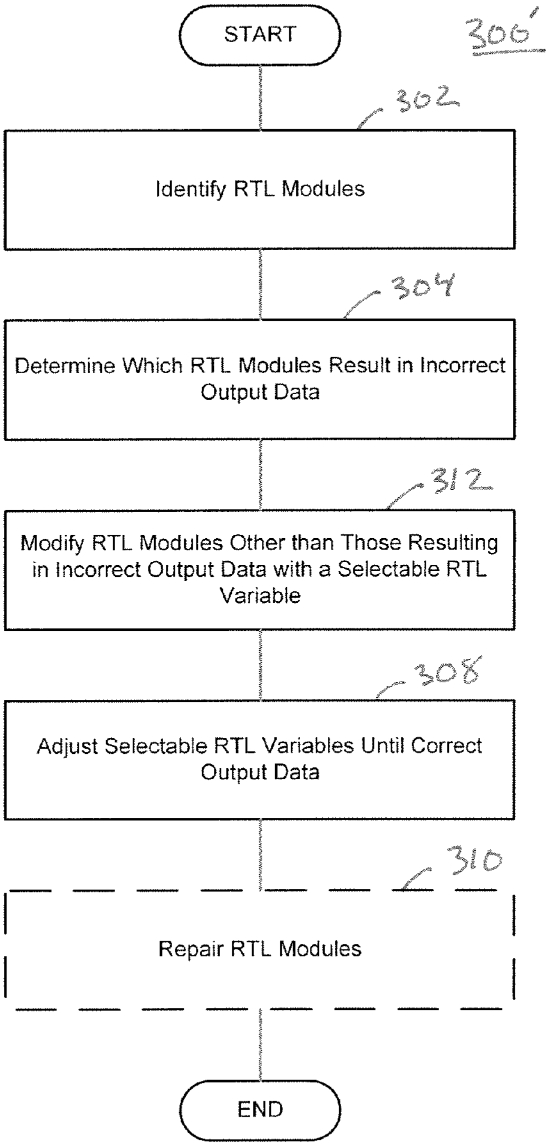
FIG. 13 illustrates a technique for RTL level diagnosis and correction in accordance with an example.

FIG. 12 illustrates another example technique 300 for RTL diagnosis and correction. A first block 302 identifies the RTL modules of the circuit design, which may include all or a predetermined subset of the RTL modules. A block 304 then determines which of these RTL modules result in incorrect output data, after which a block 306 modifies those RTL modules resulting in the incorrect output data with a selectable variable. That selectable variable is part of a conditional assignment for an RTL variable which conditional assignment also contains a free variable. The conditional state of that RTL variable produces a fixed variable output under a first condition and produces the value of the free variable under a second condition, where the first condition is a first binary condition on the select variable of the conditional state and where the second condition is a second binary condition on the select variable of the conditional state. In this way the binary state of the select variable determines the conditional state of the RTL variable. A block 308 adjusts the selectable RTL variables, one to all, until the correct output data is achieved. After this point an optional block 310 may permanently repair the RTL modules to prevent future incorrect output. FIG. 13 illustrates a similar technique 300' that is like that of technique 300, except that the block 306 is replaced with a block 312 that modifies RTL modules other than those resulting in the incorrect output data to nonetheless correct the output data. While blocks 306 and 312 are shown in the alternative, in other examples these blocks may be used in the same system to provide for modification of RTL modules resulting in incorrect output data as well as modifications of RTL modules other than those resulting in incorrect output data. For example, the blocks 306 and 312 may be operated simultaneously as part of the same modification operation.

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A method of diagnosing erroneous behavior of node outputs in a Register Transfer Level (RTL) design containing one or more RTL modules, the method comprising:

converting, using a computing device, each RTL module to an enriched RTL module having one or more conditional states that each may take the form of different values, wherein converting each RTL module to an enriched RTL module comprises performing an insertion of a conditional assignment on at least one RTL variable in each RTL module by adding at least one select variable to each RTL module;

identifying, using the computing device, an incorrect node output from the one or more RTL modules by analyzing at least one conditional assignment of the enriched RTL modules; and adjusting, using the computing device, one or more of the at least one select variable of the enriched RTL modules in order to activate or inactivate each of one or more of the at least one conditional assignment of the enriched RTL modules so as to correct the incorrect node output from the one or more of the RTL modules;

wherein the conditional assignment for an RTL variable contains the select variable and a free variable, wherein each conditional state produces a first variable output under a first condition and produces a value of the free variable under a second condition, wherein the first condition is a first condition on the select variable, and wherein the second condition is a second condition on the select variable.

2. The method of claim 1, wherein converting each RTL module to the enriched RTL module comprises performing, using the computing device, an insertion of a conditional assignment on every RTL variable in each RTL module.

3. The method of claim 1, further comprising:

generating, using the computing device, a Boolean expression of the enriched RTL modules, where the Boolean expression represents at least one adjusted conditional state to correct the incorrect node output from the RTL modules; and providing, using the computing device, the Boolean expression to a Boolean expression solver for diagnosing the Boolean expression and identifying RTL modules that result in the incorrect node output, wherein the Boolean expression solver is a Boolean satisfiability solver, a pseudo-Boolean solver, a satisfiability Modulo theory solver, an Automatic Test Pattern Generation (ATPG) solver, or integer linear programming solver.

4. The method of claim 3, further comprising repairing the RTL modules that result in the incorrect node output.

5. The method of claim 4, wherein repairing the RTL modules that result in the incorrect node output comprises modifying the RTL modules that result in the incorrect node output.

6. The method of claim 4, wherein repairing the RTL modules that result in the incorrect node output comprises modifying RTL modules other than the RTL modules that result in the incorrect node output.

7. The method of claim 4, wherein repairing the RTL modules that result in the incorrect node output comprises generating at least one corrective RTL module.

8. The method of claim 1, wherein the incorrect node output comprises incorrect node outputs from a plurality of different RTL modules.

9. The method of claim 1, wherein identifying the incorrect node output comprises:

receiving, using the computing device, a set of input vectors and corresponding correct responses of the node outputs for each of the RTL modules; and for each RTL module, executing, using the computing device, the set of input vectors and determining whether resulting responses of the node outputs equal the corresponding correct responses of the node outputs for the RTL module.

10. The method of claim 1, further comprising identifying, using the computing device, a plurality of the incorrect node outputs from the RTL modules; and adjusting, using the computing device, the one or more of the at least one select variable of the enriched RTL modules in order to activate or inactivate each of the one or more of the at least one conditional assignment of the enriched RTL modules so as to correct the plurality of incorrect node outputs from the RTL modules.

11. The method of claim 1, wherein adjusting the one or more select variables in order to activate or inactivate each of the one or more conditional assignments adjusts one or more of the conditional states of the enriched RTL modules so as to correct the incorrect node output from the one or more of the RTL modules.

12. A method of debugging an integrated circuit design expressed through Register Transfer Level (RTL) modules producing intermediate node outputs respectively, the method comprising:

determining, using a computing device, which of the RTL modules have intermediate node outputs resulting in an incorrect output data;

modifying, using the computing device, the RTL modules resulting in the incorrect output data by replacing at least one RTL variable of the RTL modules resulting in the incorrect output data with at least one switchable variable, each of the at least one switchable variable having at least two states, wherein replacing at least one RTL variable with at least one switchable variable includes adding at least one select variable to each of the RTL modules that is determined to result in the incorrect output data; and adjusting, using the computing device, one or more of the at least one select variable of at least one of the RTL modules that is determined to result in the incorrect output data until correct output data results wherein adjusting the one or more select variables controls whether one or more of the at least one switchable variable is in the first state or the second state, wherein the first state results in a first output from the corresponding RTL module and the second state results in a second output from the corresponding RTL module.

13. The method of claim 12, wherein adjusting each of the one or more select variables comprises:

setting, using the computing device, a state for the select variable to a first value and comparing the output value of the corresponding RTL module to a correct output value; and if the output value does not equal the correct output value, setting, using the computing device, the state for the select variable to a second value.

14. The method of claim 12, further comprising:

modifying RTL modules that do not produce incorrect output data by adding at least one select variable to one or more of the RTL modules that do not produce incorrect output data; and adjusting one or more of the at least one select variable of the one or more of the RTL modules that do not produce incorrect output data until correct output data is produced.

15. The method of claim 12, further comprising determining a minimum number of adjusted select variables that results in the correct output data.

16. The method of claim 12, further comprising determining more than one group of adjusted select variables, where each group results in the correct output data.

17. An article comprising a non-transitory computer-readable medium having stored thereon instructions that, when executed by a computer, cause the computer to:

convert Register Transfer Level (RTL) modules of an RTL design to enriched RTL modules each having one or more conditional states that may each take the form of different values, wherein said conversion comprises inserting a conditional assignment on at least one RTL variable in each RTL module by adding at least one select variable to each RTL module, wherein each select variable adjustable in order to activate or inactivate the respective conditional assignment of the respective enriched RTL module;

identify an incorrect node output from the RTL modules by analyzing at least one conditional assignment of the enriched RTL modules; and adjust one or more of the select variables of the enriched RTL modules in order to activate or inactivate each of one or more of the conditional assignments of the enriched RTL modules so as to correct the incorrect node output from the RTL modules wherein each conditional assignment contains the select variable and a free variable, wherein each conditional state produces a first variable output under a first condition and produces a value of the free variable under a second condition, wherein the first condition is a first condition on the select variable, and wherein the second condition is a second condition on the select variable.

18. The article of claim 17 having further instructions that, when executed by the computer, cause the computer to insert a conditional assignment on every RTL variable in each RTL module.

19. The article of claim 17 having further instructions that, when executed by the computer, cause the computer to:

generate a Boolean expression of the enriched RTL modules, where the Boolean expression represents at least one adjusted conditional state to correct the incorrect node output from the RTL modules; and provide the Boolean expression to a Boolean expression solver for diagnosing the Boolean expression and identifying RTL modules that result in the incorrect node output, wherein the Boolean expression solver is a Boolean satisfiability solver, a pseudo-Boolean solver, a satisfiability Modulo theory solver, an Automatic Test Pattern Generation (ATPG) solver, or integer linear programming solver.

20. The article of claim 17 having further instructions that, when executed by the computer, cause the computer to repair the RTL modules that result in the incorrect node output.

21. The article of claim 17 having further instructions that, when executed by the computer, cause the computer to modify the RTL modules that result in the incorrect node output.

22. The article of claim 17 having further instructions that, when executed by the computer, cause the computer to modify RTL modules other than the RTL modules that result in the incorrect node output.

23. The article of claim 17 having further instructions that, when executed by the computer, cause the computer to generate at least one corrective RTL module.

24. The article of claim 17, having further instructions that, when executed by the computer, cause the computer to:

identify a plurality of incorrect node outputs from the RTL modules; and adjust a plurality of the select variables of the enriched RTL modules in order to activate or inactivate each of a plurality of the conditional assignments of the enriched RTL modules so as to correct the plurality of incorrect node outputs.

25. The article of claim 17 having further instructions that, when executed by the computer, cause the computer to:

receive a set of input vectors and corresponding correct responses for node outputs for each of the RTL modules; and for each RTL module, execute the set of input vectors and determine whether resulting responses of the node outputs are equal to the corresponding correct responses of the node outputs for the RTL module.

26. The article of claim 17, wherein the instructions that, when executed by the computer, cause the computer to adjust the one or more select variables in order to activate or inactivate each of the one or more conditional assignments further cause the computer to adjust one or more of the conditional states of the enriched RTL modules so as to correct the incorrect node output from the RTL modules.

27. An article for debugging an integrated circuit design expressed through Register Transfer Level (RTL) modules producing intermediate node outputs respectively, the article comprising a non-transitory computer-readable medium having stored thereon instructions that, when executed by a computer, cause the computer to:

determine which of the RTL modules have intermediate node outputs resulting in incorrect output data;

modify the RTL modules resulting in the incorrect output data by replacing at least one RTL variable of the RTL modules resulting in the incorrect output data with at least one switchable variable, each of the at least one switchable variable having at least two states; and adjust one or more select variables associated with one or more of the at least one switchable variable until correct output data results, wherein the adjustment of the one or more select variables controls whether each of the one or more switchable variables is in the first state or the second state, and wherein the first state results in a first output from a corresponding RTL module and the second state results in a second output from the corresponding RTL module.

28. The article of claim 27, wherein the first output and the second output each have different binary values.

29. The article of claim 27 having further instructions that, when executed by the computer, cause the computer to:

for each select variable, set a state for the select variable to a first value and compare an output value of the corresponding RTL module to a correct output value; and if the output value does not equal the correct output value, set the state for the select variable to a second value.

30. The article of claim 27 having further instructions that, when executed by the computer, cause the computer to:

modify RTL modules that do not result in the incorrect output data by adding at least one select variable to one or more of the RTL modules that do not result in the incorrect output data; and adjust one or more of the at least one select variable of the one or more of the RTL modules that do not result in the incorrect output data until correct output data results.

31. The article of claim 27 having further instructions that, when executed by the computer, cause the computer to:

determine states of the select variables that result in the correct output data; and communicate to a user the states of the select variables that result in the correct output data.

32. The article of claim 27 having further instructions that, when executed by the computer, cause the computer to determine a minimum number of adjusted select variables that results in the correct output data.

33. The article of claim 27 having further instructions that, when executed by the computer, cause the computer to determine more than one group of adjusted select variables, where each group results in the correct output data.

* * * * *